United States Patent [19]

Moeller et al.

[11] Patent Number: 4,784,872
[45] Date of Patent: Nov. 15, 1988

[54] PROCESS FOR ENCAPSULATING MICROELECTRONIC SEMI-CONDUCTOR AND LAYER TYPE CIRCUITS

[75] Inventors: Werner Moeller, Ulm; Harald von Luettichau, Kirchheim-Oetlingen, both of Fed. Rep. of Germany

[73] Assignee: Messerschmitt-Boelkow-Blohm GmbH, Ottobrunn, Fed. Rep. of Germany

[21] Appl. No.: 909,118
[22] PCT Filed: Nov. 18, 1985
[86] PCT No.: PCT/DE85/00475
§ 371 Date: Jul. 16, 1986
§ 102(e) Date: Jul. 16, 1986
[87] PCT Pub. No.: WO86/03055
PCT Pub. Date: May 22, 1986

[30] Foreign Application Priority Data

Nov. 17, 1984 [DE] Fed. Rep. of Germany ....... 3442131

[51] Int. Cl.[4] .............................................. B05D 5/12
[52] U.S. Cl. ...................................... 427/96; 437/225; 437/245
[58] Field of Search ....................... 427/82, 88, 90, 87, 427/96; 264/272.11; 357/72; 174/52 PE

[56] References Cited

U.S. PATENT DOCUMENTS

| | | | |
|---|---|---|---|
| 3,608,029 | 9/1971 | Hough | 264/272.11 |
| 3,876,461 | 4/1975 | Flowers | 427/82 |
| 4,001,863 | 1/1977 | Kobayashi | 357/72 |
| 4,327,369 | 4/1982 | Kaplan | 427/82 |
| 4,388,132 | 6/1983 | Hoge et al. | 156/153 |

FOREIGN PATENT DOCUMENTS

| | | |
|---|---|---|
| 122687 | 10/1984 | European Pat. Off. . |
| 1514478 | 3/1973 | Fed. Rep. of Germany . |
| 2538119 | 11/1976 | Fed. Rep. of Germany . |
| 2551778 | 5/1977 | Fed. Rep. of Germany . |
| 2656139 | 6/1977 | Fed. Rep. of Germany . |
| 2628823 | 6/1978 | Fed. Rep. of Germany . |
| 2748523 | 5/1979 | Fed. Rep. of Germany . |
| 2922005 | 12/1980 | Fed. Rep. of Germany . |
| 2545471 | 4/1981 | Fed. Rep. of Germany . |
| 3137480 | 4/1982 | Fed. Rep. of Germany . |
| 3151902 | 8/1982 | Fed. Rep. of Germany . |
| 2347049 | 9/1982 | Fed. Rep. of Germany . |
| 3222791 | 12/1983 | Fed. Rep. of Germany . |
| 90967 | 9/1982 | Japan . |
| 128948 | 11/1982 | Japan . |

Primary Examiner—Shrive Beck
Assistant Examiner—Vi Duong Dang
Attorney, Agent, or Firm—W. G. Fasse; D. H. Kane, Jr.

[57] ABSTRACT

A process for encapsulating microelectronic hybrid semi-conductor circuits or microelectronic semi-conductor components in which the components, located on a substrate, receive a soft, sealable poured-on plastic coating, are covered with a plastic/metal composite film or foil and are, if necessary, then encapsulated with a hard synthetic resin sealing compound which is resistant to thermal shock. The external plastic layers of the film or foil combine with the filler or sealing compound and thus form an encapsulation which is temperature and moisture resistant.

12 Claims, 3 Drawing Sheets

PROCESS FOR ENCAPSULATING MICROELECTRONIC SEMI-CONDUCTOR AND LAYER TYPE CIRCUITS

FIELD OF THE INVENTION

The invention relates to a process for encapsulating microelectronic hybrid semi-conductor circuits, or microelectronic semi-conductor components.

DESCRIPTION OF THE PRIOR ART

Highly reliable microelectronic circuits for professional, medical, and military use require a long-term protection against the effects of moisture traces or corrosive agents. For this purpose, mostly metallic or ceramic housings are used which are hermetically sealed by welding or soldering. Such housings, for example Kovar housings, as well as the associated encapsulation technologies, for example rolled seam-, ring hump-, electron-, or laser beam welding, or glass soldering as well as glazing techniques, are very involved or costly and are not thermally uncritical for micro-circuits.

Therefore, it has been attempted for years to improve inexpensive as well as expedient plastic packaging for professional microelectronic circuits of proven use in commercial electronics and especially in consumer electronics.

For this purpose, numerous special plastic compounds and sealing techniques were developed, which are described, for example, in the following German Patent Publications Nos. DBP 2,347,049, DE-AS 2,538,119, DE-AS 2,628,823, DE-AS 2,545,471, DE-OS 2,748,523, DE-OS 2,656,139, DE-OS 3,137,480, and DE-OS 3,151,902.

It has been shown, however, that the proposed solutions did not achieve completely gas-and water-tight seals. The higher expansion coefficient of the plastic encapsulation namely leads to tensions and thereby to detachments and cracks at the ceramic boundary surfaces due to high temperature changes. Under high reliability requirements and strong thermomechanical shock loading ($-65°$ to $+125°$ C.), plastic capsules are therefore not used. Also according to MIL-M-38510 specifications until now only hermetically welded or soldered metal and ceramic housings have been acceptable.

It is further known, for example from German Patent Publication DE-PS No. 2,347,049, that bonded semi-conductor circuits may be protected by elastic cover-layers made of plastic foam. Under large temperature change loads, high thermomechanical tensions must be expected in the capsule, especially with foam cushioning, so that the boundary surfaces separate from each other and moisture or corrosive agents may penetrate along the seams. If one avoids the capsule and directly pour-seals the cover-layer with a synthetic resin which approximately matches the expansion coefficient as disclosed in German Patent Publication DE-OS No. 2,922,005, then the water-steam impermeability, or the lack of cracks as well as pores, is not assured. Also with epoxy resin-silicone elastomer combinations (DE-OS No. 2,922,005), a separation is to be expected under loads caused by large temperature change due to the low adhesion, so that, due to hair-line cracks, moisture may be distributed along the entire separation seam.

It is further known from German Patent Publications DE-OS Nos. 2,551,778, DE-PS 1,514,478 to encapsulate condensers in a moisture-tight manner with two-sided plastic laminated metal foils. However, this technique requires a geometrically simple stuctural element shape and an adhesive shrink-on plastic lamination. Hybrids which are covered by closely spaced bonded IC's or small discrete components are not adhesively laminatable in a pressureless manner without seams or hollow spaces, so that under temperature change requirements between $-65°$ and $+125°$ C. separations or wire deformations occur, which have an adverse on the electrical functional characteristics.

All of the known processes are therefore not suitable to ensure the necessary security of the encapsulation against environmental effects.

OBJECTS OF THE INVENTION

It is the aim of the invention to provide a process which substantially combines the advantages of plastic encapsulation, such as among others, the simple economical configurations, good electrical insulation, and low material costs, with the advantages of the metal and ceramic housing, namely thermomechanical shock resistance and complete sealing.

SUMMARY OF THE INVENTION

This is achieved according to the invention, in that the components located on a substrate are pour-coated with a soft, sealable plastic layer, are covered with a plastic-metal composite film or foil and are then encapsulated with a synthetic resin.

The lining of the film or foil with a pore-free, non-corrosive soft elastic covering, which bonds itself tightly to the circuit and to the plastic-metal film or foil, solves the problem previously arising in conjunction with a metal film or foil.

BRIEF DESCRIPTION OF THE DRAWINGS

Example embodiments of the invention are described with reference to the drawings, wherein.

DETAILED DESCRIPTION OF PREFERRED EXAMPLE EMBODIMENTS AND OF THE BEST MODE OF THE INVENTION

Figure 1:
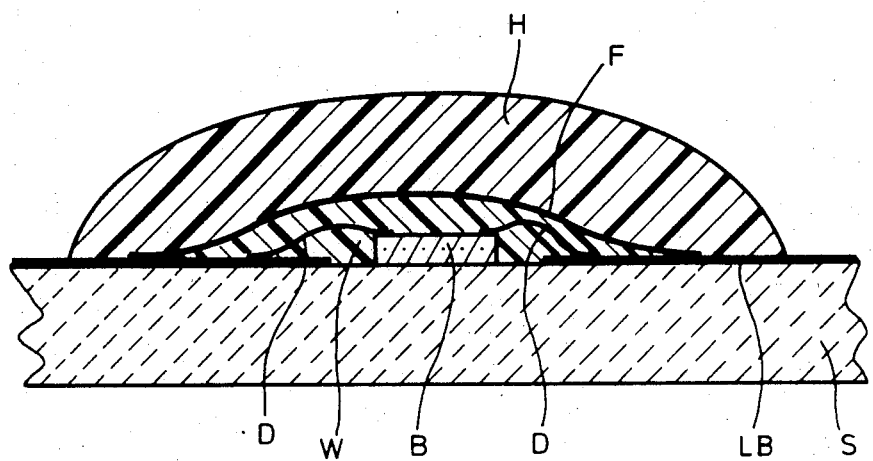
FIG. 1: shows the structure of a circuit encapsulated by the process according to the invention.

FIG. 1 shows the basic structure of a circuit encapsulated by the process according to the invention. A microelectronic component B which is passivated, for example with $Si_3N_4$, adheres to a substrate S, which advantageously is made of $Al_2O_3$. The microelectronic component B is electrically connected to the conduction paths LB by means of bond wires D which are made of gold, aluminum, or other highly conductive metal. The component B and the bond wires are located within a soft, plastic filling layer W. This layer is covered by a film or foil F which includes a metal layer, and the structure of which will be described below. This structure is encapsulated with an epoxy resin H and a highly pure $SiO_2$ or chalk filling.

In recent years, the Wacher Co. developed and made available elastomers made of silicone and (approximately 50%) thermoplastic polymers, which are distinguished from the pure silicone elastomers by an increased mechanical rigidity, satisfactory adhesion to components, ceramic, metal, etc., and especially by a small water-steam permeability and therefore are exceptionally suitable as a cover-layer. Additionally, within the scope of the experiments underlying the invention, it was found that the elastomers being used could be welded to the plastic film by means of thermocompression.

Thus, a composite system of plastic-metal layers results. The differing expansion coefficients, the electric contacts and further difficulties at first stand in the way of such a solution, for example, a combined pour-coating and vapor deposition technique. The metallic vapor deposited layers are not gas-tight and may be attached by synthetic resins, for example epoxy resin, under the effects of heat or moisture.

A complete solution according to the invention thus requires that the microelectronic circuit B which is bonded to a substrate S and which is passivated, for example with $Si_3N_4$, is coated by a plastic filling layer W which is soft at the operation temperature range. This plastic filling layer W may be sealed or glued to a heat- and crack-free moldable plastic-metal-plastic composite film or foil F and, if necessary, encapsulated and strengthened by a highly filled, strongly cross-linked synthetic resin H.

Figure 2:
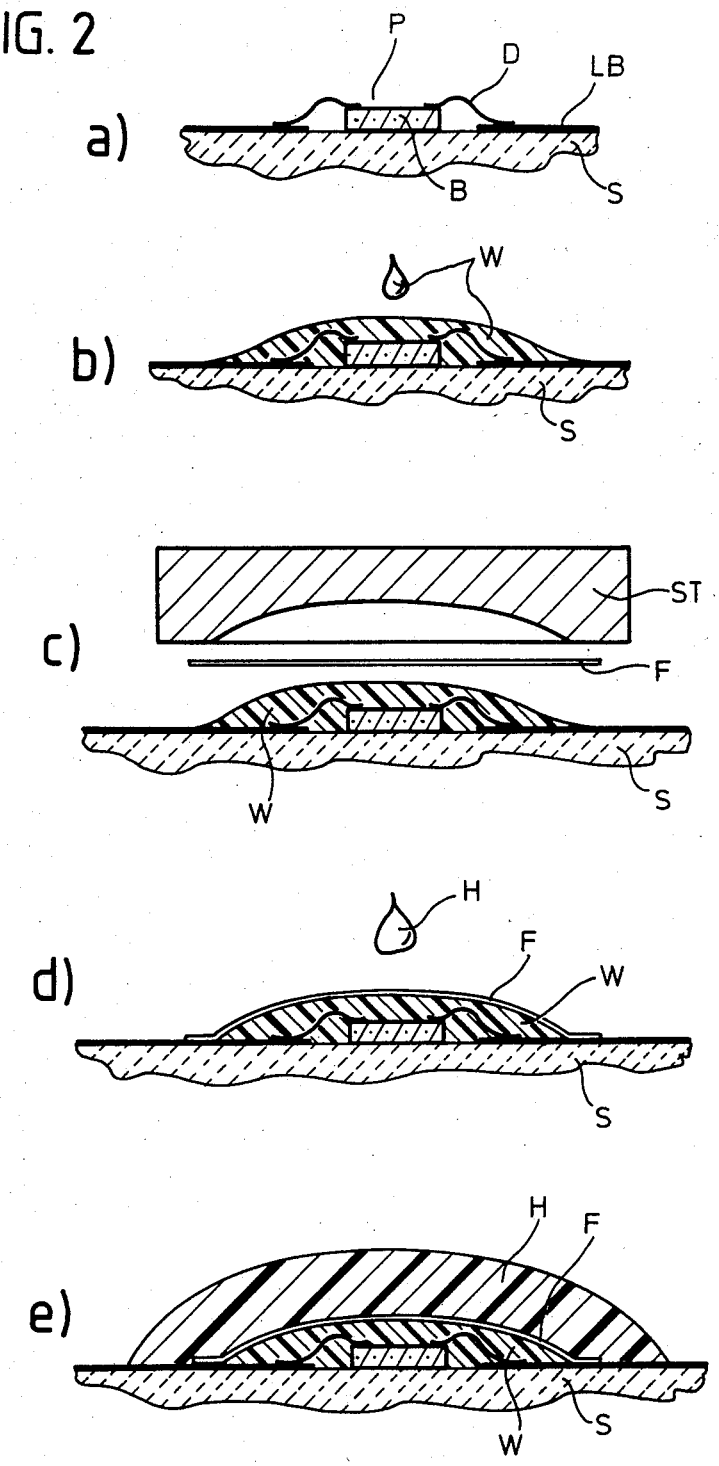
FIG. 2: shows schematically, the steps of a first embodiment of the present method.

The proven hot seal process of FIG. 2 is especially suitable for economically carrying out the method according to the invention.

According to step (a) of FIG. 2 the bonded component B is first located on the substrate S. The bond wires D electrically connect the component B to the conduction paths LB. A passivation P prevents any undesired corrosion. In this state the prepared circuit is next preheated. Then according to step (b), a low-viscosity fluid elastomer is applied forming a filling layer W, which is hot sealable. In the third step (c) the metal composite film F is applied and pressed onto the filling layer W with a hollow stamp ST and heated to approximately 200° C., whereby the plastic side of the film F facing the filling layer W becomes attached to the latter under the influence of heat and pressure. During the subsequent cooling, the filling layer W becomes hardened. Moreover, a deformation of the composite film during the stamping-out has been found to be advantageous.

Then in this case, according to the process step d), the previously constructed element is pour-coated with an epoxy resin H. The end product shown in FIG. 2e corresponds to that of FIG. 1.

Thus, this process is based on the fact that silicones which are, for example modified with polyolefin, can be easily deformed and sealed with polypropylene film at 160°–190° C. under pressure. Rolled copper or aluminum foils are preferably considered as the inner metal layer, and highly pure polypropylene-polyethylene-, polyethylene terephthalate-, polycarbonate-, polyamid-films are preferably considered as the covering. Delamination or crack formation is unknown in such composite films or foils, the gas and moisture permeability is smaller by several powers of ten than that of epoxy resin or silicone elastomer packagings. Diffusion and permeation is only posible along the approximately 10–100$\mu$ thick, but millimeter long boundary layer between the semi-conductor circuit and the aluminum layer. The rolled metal film or foil, which is electrically insulated on both sides, additionally facilitates a fast temperature equalization in power semi-conductor circuits or power hybrid circuits.

Automatic die-bonds, which are known as such, are advantageously used to apply the films or foils. These may preferably be coupled in the same work stroke with the stamping tool for the films.

Figure 3:
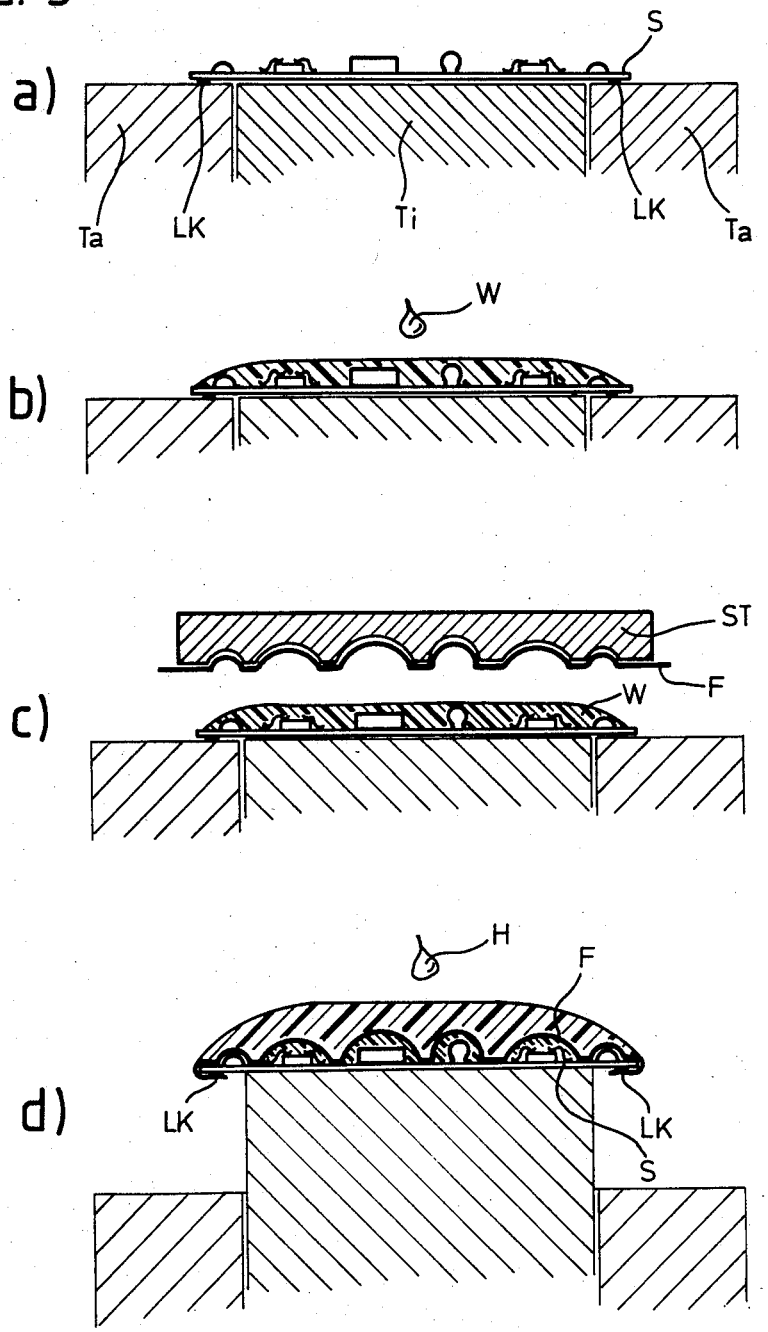
FIG. 3: is a second variant of the present process.

FIG. 3 shows another variant of the process according to the invention, wherein the substrate S with the components is located on a carrier comprising an inner portion Ti and an outer portion Ta. The edge of the substrate projects beyond the inner portion Ti of the carrier and has a printed soldering ring LK on its back side. The conduction paths are insulated from the soldering ring by a dielectric layer during the thick film screen-printing. The process step (b) is achieved as in the example of FIG. 2.

During the process step (c), that is during application of the film or foil, a film F, which is preformed corresponding to the topology of the components, is utilized. Similarly, the stamp ST is fitted to the specific shape of the film or foil. After the film is applied and the outer portion Ta of the carrier is removed, the film or foil is rolled over the edges of the substrate and soldered to the soldering ring corresponding to FIG. 3d. Next the element may be pour-coated with epoxy resin H.

Copper films laminated on one side are especially suitable for the soldering. The epoxy resin-quartz pour-coating or embedding serves as a mechanical protection. In the following, three example embodiments are described.

EXAMPLE 1

The chip or rather the passivated semi-conductor circuit is placed on the carrier or substrate and bonded at the connections. The chip as well as all the bond connections are covered with a low-viscosity plastics which is characterized by an extremely low gas and water-steam permeability, high flexibility and sealability. In this case a polyolefin modified silicone solution in benzine is applied to the substrate, which is based on p-methyldioxolane-methyl methacrylate.

A cap dimensioned for the chip is hot stamp-cut (approximately 120° C.) from a polypropylene-(75$\mu$), aluminum-(10$\mu$),polyethylene terephthalate-(15$\mu$) -composite film or foil. This cap is then inverted over the chip carrier with a die-bonder and tightly sealed with the soft pour-coating by means of a hot hollow stamp. The approximately 180° C. hot hollow stamp presses the film along with the fluid soft pour-coating, against the substrate so that the seal layer remains approximately under 20$\mu$. Next the cap or rather the encapsulated circuit, is pour-coated with a high-purity, flexible, epoxy resin/quartz powder pour-coat sealing compound, comprising 100 wt. portion ECN 1280 (CIBA) resin,
120 wt. portion Dodecenylsuccinic acid anhydride,
0.5 wt. portion piperidine,
2 wt. portion p-methyldioxolane - methyl methacrylate, and
300 wt. portion vacuum-dried, high-purity quartz powder (x=30$\mu$). The above compound is suitable as the pour-sealed compound. This thixotropic pour-coat sealing compound is mixed and applied at 140° and hardened for 5 hours.

EXAMPLE 2

A thick layer hybrid circuit with semi-conductor chips and discrete components is lacquered with a hot polyethylene/xylol solution, covered with an appropriately precut and possibly preformed composite film or foil pressed onto the substrate and glued or sealed. The encapsulated hybrid circuit is then press-coated or pour-coated with a filled epoxy resin.

EXAMPLE 3

A bonded hybrid circuit is preheated to approximately 100° C., placed in a vacuum holding apparatus and covered by a copper-($25\mu$) adhesive film or foil, which is precut and preformed corresponding to the circuit.

The conduction paths of the circuit are covered with a dielectric paste at the proposed contact or soldering points during the screen printing. These points are printed with soldering paste before the film sealing step.

The film is folded under vacuum, sealed with the resin, subsequently soldered and press-coated or pour-coated with a filled epoxy resin.

In one embodiment of the present process a semi-conductor circuit or a semi-conductor component is encapsulated as follows. First, the circuit or components B are located on a substrate S and then pour-coated with a soft, sealable plastic filling W to form an intermediate embedded product in which the circuit or component is hermetically enclosed on the substrate. The so formed intermediate product is then covered with a composite film or foil F comprising three layers. The first layer is a plastic layer comprising a sealable polyolefin, preferably polypropylene, with a layer thickness within the range of 10 to $100\mu$. The preferred thickness is about $75\mu$. The second layer of the film comprises a deformable metal with a layer thickness within the range of 0.25 to $250\mu$. The preferred thickness is 10 to $30\mu$ and the preferred metal is aluminum. The third layer of the film comprises an adhesive polyester, preferably polyethylene terephthalate with a layer thickness within the range of 1 to $100\mu$. The preferred thickness is about $10\mu$. The so pour-coated and covered component is then encapsulated with a synthetic resin H in such a way that the above mentioned first plastic layer of the film or foil is connected and intimately bonded to the sealable plastic filling layer W and so that the third layer is connected and intimately bonded to the synthetic resin H.

In a second embodiment of the present method, the pour-coated component on the substrate is covered with a two-layer plastic-metal composite film or foil F. The first plastic layer of the film or foil comprises a sealable polyolefin with a layer thickness within the range of 10 to $100\mu$. The preferred thickness is about $75\mu$. The preferred sealable polyolefin is preferably polypropylene. The second metal layer of the composite film or foil F is made of a deformable solderable metal with a layer thickness in the range of 0.25 to $250\mu$. The preferred thickness is about 10 to $30\mu$. The composite film or foil is then folded so that the plastic layer is on the inside and then the second metal layer is hermetically soldered to a soldering ring LK which has been printed on the substrate S. The so formed component is then encapsulated with synthetic resin H so that the first plastic layer of the composite film is intimately bonded to the filling layer W and the middle metal layer is intimately bonded to the synthetic resin H.

The filling layer W is, for example, formed by a flexible epoxy resin having a low viscosity and a high purity. Relative to the circuit components the epoxy resin of layer W is inert. The epoxy resin has the required adhesive properties relative to the semi-conductor circuit and relative to the composite film or foil.

In another embodiment the filling layer W is made of a hot sealable coating having a high purity and which is soft. The coating is inert relative to the semi-conductor circuit. Especially a modified silicone containing polyolefin or a silicone adhesive on the basis of silicone fluorine is suitable for use in the pour-coating step.

The plastic-metal-plastic composite film or foil is formed of three layers by means of a hot sealing deformation at temperatures in the range of 30° to 250° C. and at a pressure within the range of 1 to 50 bars. The preferred temperature is within the range of 160° to 190° C. and the preferred pressure is within the range of 5 to 10 bars. The pressure is applied outside of the wiring and of the bonding points. The heating and pressure application can be performed by using heatable hollow stamps ST or matrix dies to achieve the required heating and deformation.

The above mentioned encapsulating step in which the three-layer or two-layer film or foil is coated, may also be performed as a pour-coating step.

Although the invention has been described with reference to specific example embodiments, it will be appreciated, that it is intended to cover all modifications and equivalents within the scope of the appended claims.

We claim:

1. A process for encapsulating microelectronic hybrid semi-conductor circuits or microelectronic semi-conductor components, comprising the following steps:

pour-coating the components (B) located on a substrate (S) with a soft, sealable plastic filling layer (W) to form an intermediate embedded product in which said component is hermetically enclosed on said substrate, covering said intermediate product with a plastic-metal-plastic composite film or foil (F) comprising three layers, of which a first plastic layer comprises a sealable polyolefin, preferably polypropylene, with a layer thickness of 10–$100\mu$, of which a second layer comprises a deformable metal with a layer thickness of 0.25–$250\mu$, and of which a third layer comprises an adhesive polyester with a layer thickness of 1–$100\mu$, and then encapsulating the pour-coated and covered component with synthetic resin (H) so that the first plastic layer of the film or foil is connected and intimately bonded to the sealable plastic filling layer (W) and so that the third layer is connected and intimately bonded to the synthetic resin (H).

2. The process of claim 1, wherein a high-purity, relative to the circuit components inert, low-viscosity, flexible epoxy resin with adhesive properties appropriate for the semi-conductor circuit and composite films or foils is used as a filling in the pour-coating step to form said filling layer (W).

3. The process of claim 1, wherein a high-purity, soft, with respect to the semi-conductor circuit inert, hot-sealable coating, especially made of modified silicone containing polyolefin or of silicone adhesive on a silicone-fluorine base, is used as a filling in the pour-coating step to form said filling layer (W).

4. The process of claim 1, wherien the plastic-metal-plastic composite is made of a base and film or foil by means of a hot-sealing deformation at temperatures of 30°–250° C. and at pressures of 1–50 bar outside of the wiring and the bonding points.

5. The process of claim 1, further comprising using heatable hollow stamps (ST) or matrix dies for the heating and deformation.

6. The process of claim 5, further comprising pour-coating the composite film or foil encapsulation.

7. A process for encapsulating microelectronic hybrid semi-conductor circuits or microelectronic semi-conductor components, comprising the following steps:
   by pour-coating the components (B) located on a substrate (S) with a soft sealable plastic filling layer (W), to form an intermediate embedded product,
   covering said intermediate product with plastic-metal composite film or foil (F) comprising two layers
      of which a first plastic layer comprises a sealable polyolefin with a layer thickness of 10–100μ, and
      of which a second metal layer comprises a deformable and solderable metal with a layer thickness of 0.25–250μ,
   folding the film or foil with the first plastic layer to the inside and hermetically soldering the second metal layer to a soldering ring (LK) previously printed on the substrate (S),
   and then encapsulating the component and film or foil with synthetic resin (H) so that said first plastic layer is intimately bonded to said filling layer (W), and said metal layer is intimately bonded to said synthetic resin.

8. The process of claim 7, wherein a high-purity, relative to the circuit components inert, low-viscosity, flexible epoxy resin with adhesive properties appropriate for the semi-conductor circuit and composite films or foils are used as a filling in the pour-coating step for forming said layer (W).

9. The process of claim 7, wherein a high purity, soft, with respect to the semi-conductor circuit inert, hot-sealable coating, especially made of modified silicone containing polyolefin or of silicone adhesive on a silicone-fluorine base, is used as a filling in the pour-coating step for forming said layer (W).

10. the process of claim 7, wherein said plastic metal composite is made of a base and film or foil by means of a hot-sealing deformation at temperatures of 30°–250° C. and at pressures of 1–50 bar outside of the wiring and the bonding points.

11. The process of claim 7, further comprising using heatable hollow stamps (ST) or matrix dies for the heating and deformation.

12. The process of claim 11, further comprising pour-coating the composite film or foil encapsulation.

* * * * *